US010514043B2

(12) United States Patent
Lin et al.

(10) Patent No.: US 10,514,043 B2
(45) Date of Patent: Dec. 24, 2019

(54) CENTRIFUGAL FAN

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 85 days.

(21) Appl. No.: 15/866,721

(22) Filed: Jan. 10, 2018

(65) Prior Publication Data
US 2018/0223865 A1    Aug. 9, 2018

(30) Foreign Application Priority Data

Feb. 3, 2017   (CN) .................. 2017 2 0105788 U

(51) Int. Cl.
*F04D 29/42* (2006.01)
*F04D 29/44* (2006.01)
*H05K 7/20* (2006.01)

(52) U.S. Cl.
CPC ......... *F04D 29/441* (2013.01); *F04D 29/424* (2013.01); *H05K 7/20172* (2013.01)

(58) Field of Classification Search
CPC ........ F04D 29/40; F04D 29/403; F04D 29/42; F04D 29/4206; F04D 29/4226; F04D 29/424; F04D 29/441; F04D 17/16; F04D 17/162; F04D 17/04; F05D 2250/51; H05K 7/20172
See application file for complete search history.

(56) References Cited

U.S. PATENT DOCUMENTS

| 7,220,101 | B2 | 5/2007 | Chen et al. | |
|---|---|---|---|---|
| 9,458,857 | B2 | 10/2016 | Yang et al. | |
| 2007/0104573 | A1* | 5/2007 | Sun | ........................ F04D 25/08 415/206 |
| 2014/0030082 | A1* | 1/2014 | Helmenstein | ........... F04D 17/16 415/206 |

FOREIGN PATENT DOCUMENTS

| TW | 200532116 A | 10/2005 |
|---|---|---|
| TW | 201418581 A | 5/2014 |

* cited by examiner

*Primary Examiner* — Richard A Edgar
(74) *Attorney, Agent, or Firm* — McClure, Qualey & Rodack, LLP

(57) ABSTRACT

A centrifugal fan comprises a casing and a fan impeller. The casing comprises a first cover, a second cover, a side wall structure and a isolating structure. The side wall structure is connected between the first cover and the second cover to form an accommodating space. The side wall structure includes a first air inlet and an air outlet. The isolating structure is disposed between the first cover and the second cover to distinguish the accommodating space into a first subspace and a second subspace. The isolating structure includes a through hole. As a result, airflow is guided from a side to the first air inlet easily. Then, the air inlet volume and air outlet volume of the centrifugal fan are improved.

9 Claims, 6 Drawing Sheets

CENTRIFUGAL FAN

CROSS-REFERENCE TO RELATED APPLICATION

This application claims the priority benefit of CN application serial No. 201720105788.1, filed on Feb. 3, 2017. The entirety of the above-mentioned patent application is hereby incorporated by references herein and made a part of specification.

BACKGROUND OF THE INVENTION

Field of the Invention

The disclosure relates to a centrifugal fan.

Description of the Related Art

Generally, electronic components are easily abnormal when the electronic components overheat. As a result, a fan is usually configured at the electronic components which generates high temperature, such as a power supply, a central processing unit (CPU) and a graphic processing unit (GPU), to dissipate the heat of the electronic components. However, with miniaturization trend of the electronic device, the configuration space and the efficiency improvement of the fan are limited.

BRIEF SUMMARY OF THE INVENTION

According to a first aspect, a centrifugal fan is provided. The centrifugal fan comprises a casing and a fan impeller. The casing comprises: a first cover, a second cover, a side wall structure connected between the first cover and the second cover to form an accommodating space, the side wall structure includes a first air inlet and an air outlet; and a isolating structure disposed in the accommodating space; wherein the first air inlet is interconnected to the air outlet via the isolating structure. The fan impeller is disposed between the isolating structure and the first cover.

These and other features, aspects and advantages of the present invention will become better understood with regard to the following description, appended claims, and accompanying drawings.

DETAILED DESCRIPTION OF THE EMBODIMENTS

Figure 1:
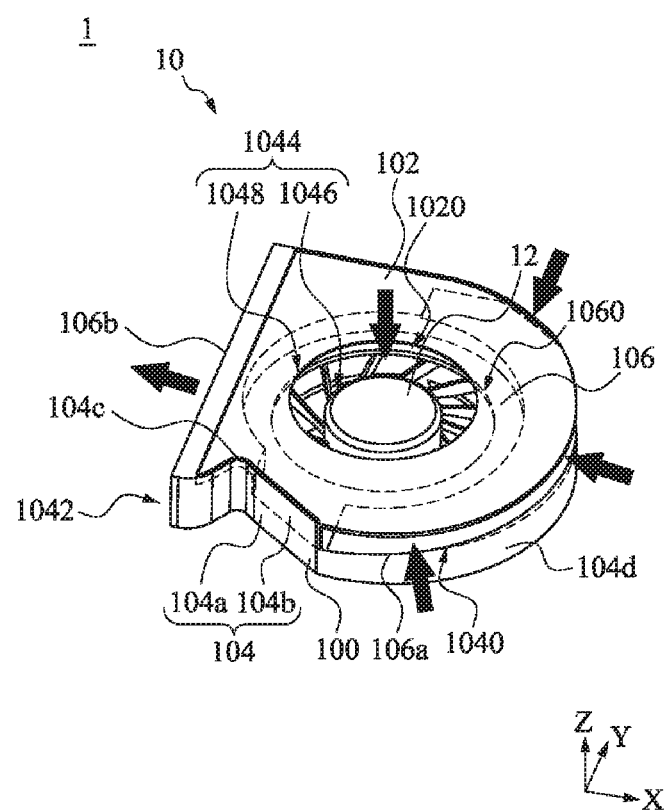
FIG. 1 is a schematic diagram showing a centrifugal fan in an embodiment.
Figure 2:
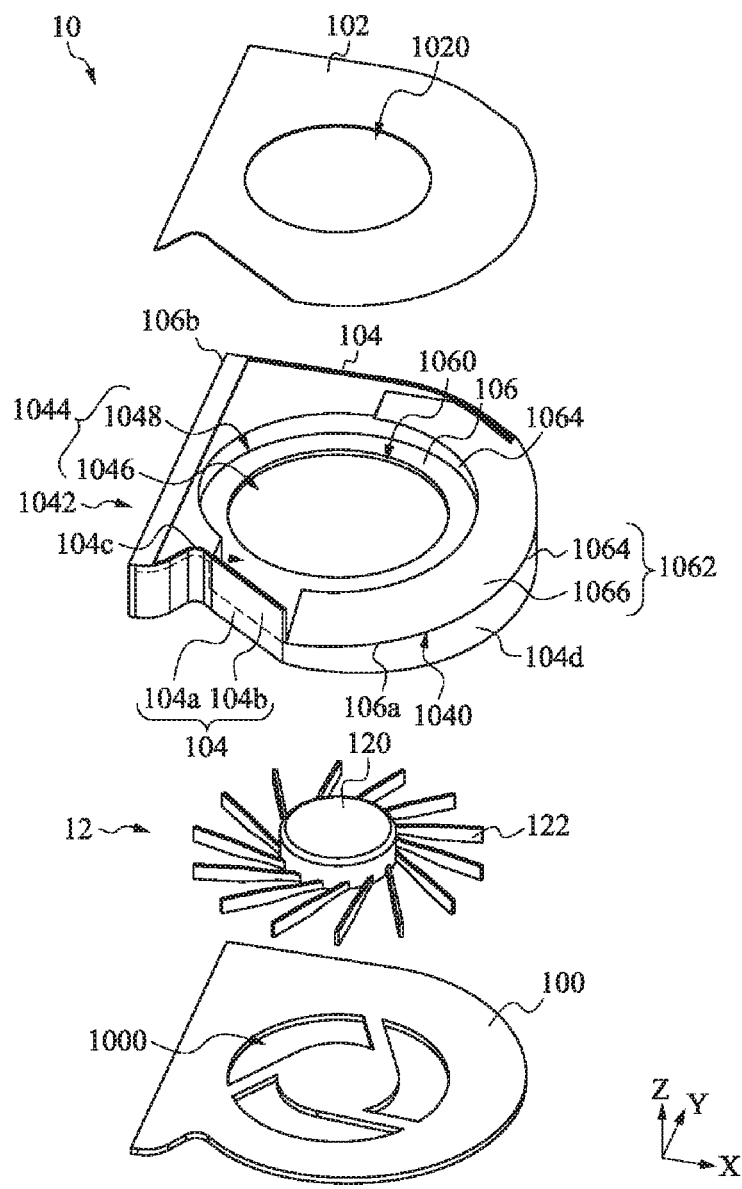
FIG. 2 is an exploded diagram showing a centrifugal fan in an embodiment.

Please refer to FIG. 1 and FIG. 2. FIG. 1 is a schematic diagram showing a centrifugal fan 1 in an embodiment. FIG. 2 is an exploded diagram showing a centrifugal fan 1 in FIG. 1 in an embodiment. In an embodiment, a centrifugal fan 1 includes a casing 10 and a fan impeller 12. The casing 10 includes a first cover 100, a second cover 102, a side wall structure 104 and an isolating structure 106.

In FIG. 1 and FIG. 2, the side wall structure 104 is connected between the first cover 100 and the second cover 102. The side wall structure 104 is perpendicular to the first cover 100 and the second cover 102, respectively. The side wall structure 104 surrounds an accommodating space 1044 (please refer to FIG. 4D). The isolating structure 106 is located between the first cover 100 and the second cover 102 to define the side wall structure 104 into a bottom side wall structure 104a and an upper side wall structure 104b. The accommodating space 1044 is separated into a first subspace 1046 and a second subspace 1048. The bottom side wall structure 104a is located in a side of the side wall structure 104 away from the second cover 102. The bottom side wall structure 104a is connected between the first cover 100 and the isolating structure 106. The upper side wall structure 104b is located in a side of the side wall structure 104 away from the first cover 100. The upper side wall structure 104b is connected between the second cover 102 and the isolating structure 106. In an embodiment, the first subspace 1046 is defined by a space surrounded by the first cover 100, the isolating structure 106 and the bottom side wall structure 104a. The second subspace 1048 is defined by a space surrounded by the second cover 102, the isolating structure 106 and the upper side wall structure 104b.

In an embodiment, the side wall structure 104 includes a first air inlet 1040 and an air outlet 1042, but the number of the first air inlet 1040 and the air outlet 1042 are not limited herein. Moreover, the first air inlet 1040 is formed in the upper side wall structure 104b of the side wall structure 104. The air outlet 1042 is formed in the bottom side wall structure 104a of the side wall structure 104.

In an embodiment, the isolating structure 106 and the side wall structure 104 are integratedly formed. The isolating structure 106 includes an annular edge 106a. The side wall structure 104 includes a tongue portion 104c and an annular portion 104d. The annular edge 106a of the isolating structure 106 is located under the first air inlet 1040, and the annular edge 106a is located in an edge of the first air inlet 1040 close to the first cover 100. The annular edge 106a surrounds the accommodating space 1044. The tongue portion 104c of the side wall structure 104 is located between the first air inlet 1040 and the air outlet 1042. The tongue portion 104c is close to the air outlet 1042 and is protruded towards the accommodating space 1044. The annular portion 104d is a part of the bottom side wall structure 104a. The annular portion 104d is located under the first air inlet 1040. The annular portion 104d surrounds the first subspace 1046 of the accommodating space 1044.

In an embodiment, the first air inlet 1040 is configured between the isolating structure 106 and the second cover 102 along a direction Z. The first air inlet 1040 is configured between an end of the upper side wall structure 104b close to the tongue portion 104c and the other end away from the tongue portion 104c along the annular edge 106a of the isolating structure 106. In the embodiment, the first air inlet 1040 is an opening in a partial annular shape. The first air inlet 1040 is located above the annular portion 104d of the side wall structure 104. A profile of the opening of the first air inlet 1040 is conformed to an annular surface of the annular portion 104d. In an embodiment, a width of the first air inlet 1040 in the direction Z and a range of the first air inlet 1040 along the annular edge 106a of the isolating structure 106 are changed according to practical requirements. Moreover, a position of the first air inlet 1040 in the upper side wall structure 104*b* is adjusted according to practical requirements.

In an embodiment, the air outlet 1042 is disposed corresponding to the first air inlet 1040. The air outlet 1042 is disposed between the isolating structure 106 and the first cover 100 along the direction Z. The air outlet 1042 is disposed between an end of the bottom side wall structure 104*a* close to the tongue portion 104*c* and the other end away from the tongue portion 104*c* along a straight edge 106*b* of the isolating structure 106. The first subspace 1046 of the accommodating space 1044 is interconnected to an outside of the casing 10 via the air outlet 1042 in the bottom side wall structure 104*a*. The second subspace 1048 of the accommodating space 1044 is interconnected to the outside of the casing 10 via the first air inlet 1040 in the upper side wall structure 104*b*.

In an embodiment, the isolating structure 106 includes a through hole 1060. The through hole 1060 is a circular hole formed in a center part of the isolating structure 106. The configuration of the through hole 1060 is not limited herein. The second subspace 1048 of the accommodating space 1044 is interconnected to the first subspace 1046 via the through hole 1060 in the isolating structure 106. In an embodiment, the fan impeller 12 is rotatable in the first subspace 1046 of the accommodating space 1044. The fan impeller 12 includes a fan hub 120 and fan blades 122. The fan blades 122 of the fan impeller 12 cover the bottom of the isolating structure 106. The fan blades 122 are located in a periphery of the through hole 1060.

The airflow outside the casing 10 flows into the second subspace 1048 in the casing 10 from a side edge of the casing 10 via the first air inlet 1040 in the upper side wall structure 104*b*. Then, the airflow flows into the first subspace 1046 in the casing 10 from the second subspace 1048 via the through hole 1060 of the isolating structure 106. Then, the airflow flows out of the casing 10 from the first subspace 1046 via the air outlet 1042 in the bottom side wall structure 104*a*.

In an embodiment, the second cover 102 includes a second air inlet 1020. The first cover 100 includes a third air inlet 1000. The first subspace 1046 of the accommodating space 1044 is interconnected to the outside of the casing 10 via the air outlet 1042 in the bottom side wall structure 104*a*. The first subspace 1046 is interconnected to the outside of the casing 10 via the third air inlet 1000 of the first cover 100. The second subspace 1048 of the accommodating space 1044 is interconnected to the outside of the casing 10 via the first air inlet 1040 in the upper side wall structure 104*b*. The second subspace 1048 is interconnected to the outside of the casing 10 via the second air inlet 1020 of the second cover 102. As a result, the airflow flows into the casing 10 via the second air inlet 1020 or the third air inlet 1000 along the direction Z. Then, the air volume at the air inlet and the air outlet of the centrifugal fan 1 is improved. In an embodiment, the through hole 1060 of the isolating structure 106 corresponds to the second air inlet 1020 of the second cover 102 and the third air inlet 1000 of the first cover 100.

Figure 3:
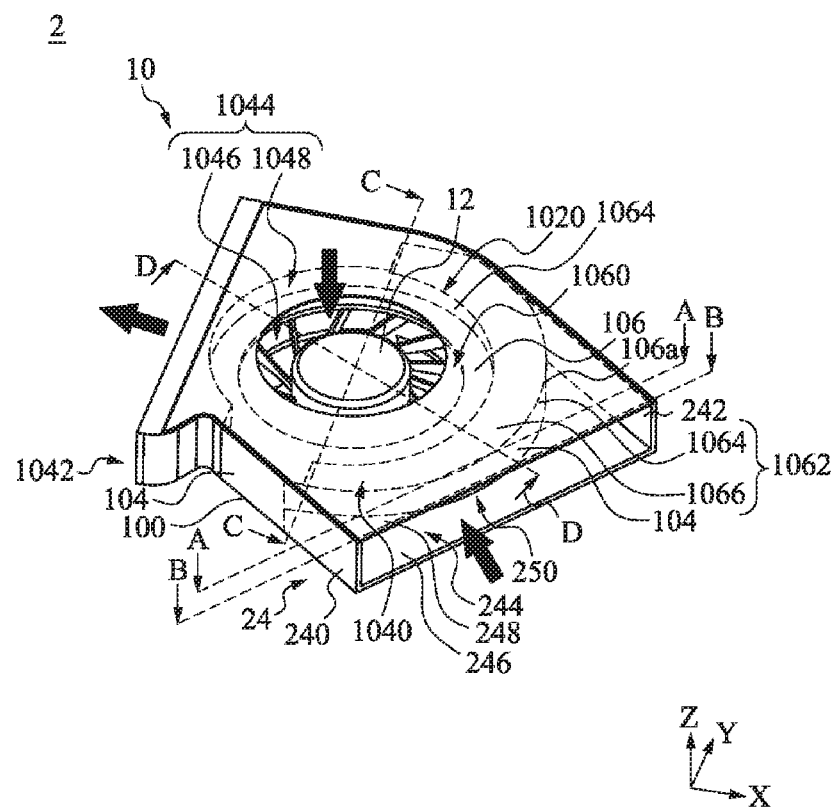
FIG. 3 is a schematic diagram showing a centrifugal fan in an embodiment.

Please refer to FIG. 3. FIG. 3 is a schematic diagram showing a centrifugal fan in an embodiment. As shown in FIG. 3, in an embodiment, the structure, the function and the connection between the components of the casing 10 and the fan impeller 12 of the centrifugal fan 2 are similar to those of the centrifugal fan 1 in FIG. 1 and FIG. 2, which is not repeated herein.

The difference between the embodiment and the embodiment in FIG. 1 is that the centrifugal fan 2 further includes a guiding channel 24. The guiding channel 24 includes a first guiding side wall 240, a second guiding side wall 242, a bottom guiding cover 246 and an upper guiding cover 248. The height of the first guiding side wall 240 and the height of the second guiding side wall 242 in the direction Z are same as the height of the side wall structure 104 in the direction Z. An end of the first guiding side wall 240 and an end the second guiding side wall 242 are adjacent to two sides of the first air inlet 1040 in the side wall structure 104, respectively. The first guiding side wall 240 and the second guiding side wall 242 are extended towards a direction away from the fan impeller 12.

The bottom guiding cover 246 is extended from the first cover 100, and the upper guiding cover 248 is extended the second cover 102, respectively, along the direction away from the fan impeller 12. The bottom guiding cover 246 and the upper guiding cover 248 are disposed between the first guiding side wall 240 and the second guiding side wall 242. The first guiding side wall 240, the second guiding side wall 242, the bottom guiding cover 246 and the upper guiding cover 248 are encircled together to form a guiding space 250. The guiding channel 24 includes an opening 244. In an embodiment, the second subspace 1048 of the casing 10 is interconnected to the guiding space 250 of the guiding channel 24 via the first air inlet 1040 in the side wall structure 104. Then, the second subspace 1048 is further interconnected to the outside of the casing 10 via the opening 244 of the guiding channel 24.

Figure 4A:
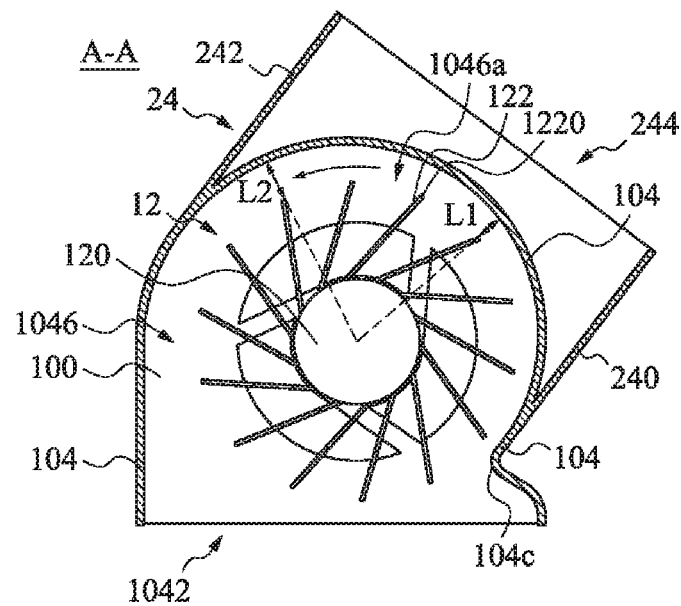
FIG. 4A to FIG. 4D are section views of a centrifugal fan in FIG. 3 along a line A-A, a line B-B, a line C-C and a line D-D, respectively.
Figure 4B:
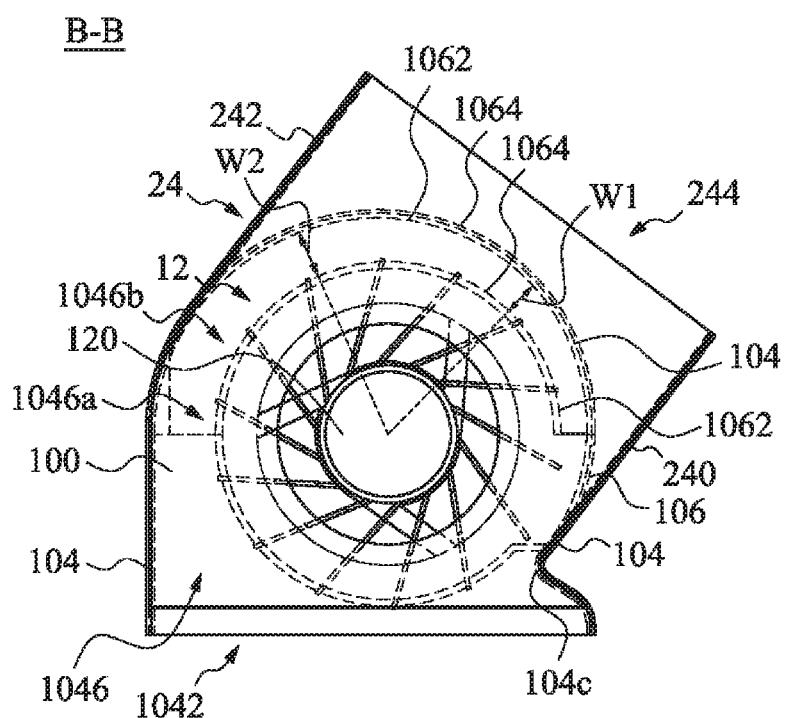
Figure 4C:
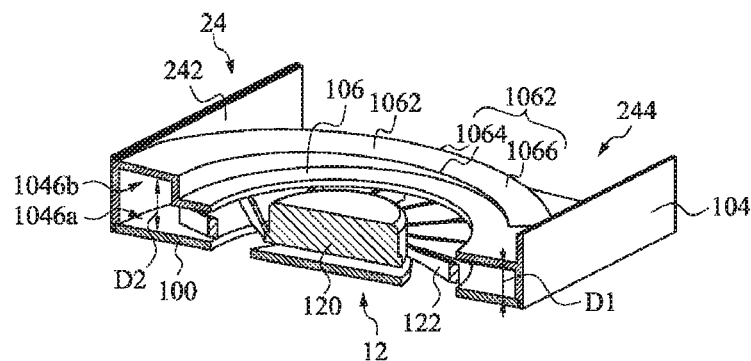

In FIG. 3, the isolating structure 106 further includes a concave portion 1062 (please refer to FIG. 4C). Part of the isolating structure 106 is concaved towards the second cover 102 to form the concave portion 1062. The concave portion 1062 is close to the annular edge 106*a* of the isolating structure 106. The first air inlet 1040 is formed between a bottom 1066 of the concave portion 1062 and the second cover 102. The number of the concave portion is not limited herein.

In FIG. 3, the concave portion 1062 includes two side walls 1064 opposite to each other and the bottom 1066 (please refer to FIG. 4C) connected between the two side walls 1064. The two side walls 1064 (shown in FIG. 4C) of the concave portion 1062 are perpendicular to the first cover 100. The two side walls 1064 are extended towards the second cover 102. The two side walls 1064 surrounds the through hole 1060 in different distances relative to the through hole 1060 of the isolating structure 106, respectively. As a result, in an embodiment, the concave portion 1062 surrounds the through hole 1060 of the isolating structure 106.

Please refer to FIG. 4A to FIG. 4D. FIG. 4A to FIG. 4D are section views of a centrifugal fan in FIG. 3 along a line A-A, a line B-B, a line C-C and a line D-D, respectively. The line A-A in FIG. 3 is located under the concave portion 1062 of the isolating structure 106. The line B-B in FIG. 3 is located above the concave portion 1062 of the isolating structure 106. The first cover 100 of the centrifugal fan 2 is not shown in FIG. 4C.

In FIG. 4A, a distance is between a fan blade edge 1220 of the fan blade 122 and the side wall structure 104 to form a first airflow channel 1046*a*. A width of the first airflow channel 1046*a* is increased gradually from a side close to the tongue portion 104*c* of the side wall structure 104 to a side away from the tongue portion 104*c*. In an embodiment, the width between the side wall structure 104 and the fan blade edge 1220 of the fan blades 122 closest to the tongue portion 104c is L1. The width between the side wall structure 104 and the fan blade edge 1220 of the fan blades 122 farthest away from the tongue portion 104c is L2. The width L2 is greater than the width L1.

When the fan hub 120 in the first subspace 1046 is rotated in an anticlockwise direction, the fan blades 122 of the fan impeller 12 are driven by the fan hub 120 to push the airflow. Then, the airflow flows around the fan hub 120. When the airflow flows through the first airflow channel 1046a, since the width of the first airflow channel 1046a is increased gradually towards a rotation direction of the fan hub 120, the volume of the airflow is improved. Then, the airflow resistance due to the casing 10 is reduced. As a result, part of kinetic energy of the airflow is converted to pressure (such as a dynamic pressure and a static pressure) energy. Then, the airflow is dissipated out of the casing 10 from the first subspace 1046 via the air outlet 1042 in the bottom side wall structure 104a.

In FIG. 4B, the isolating structure 106 includes a concave portion 1062. A second airflow channel 1046b is formed by two side walls 1064 and the bottom 1066 (shown in FIG. 4C) of the concave portion 1062. The second airflow channel 1046b is located above the first airflow channel 1046a. Airflow can be accommodated in the second airflow channel 1046b formed by the concave portion 1062 of the isolating structure 106. Then, the volume of the airflow in the first subspace 1046 is improved, and the airflow volume of the air inlet and the air outlet of the centrifugal fan 1 is improved. The height of the airflow channel is increased via a space perpendicular to the first cover 100 of the centrifugal fan 2. As a result, the efficiency of the centrifugal fan 2 is improved.

The distance between two side walls 1064 of the concave portion 1062 is changed with the rotation direction of the fan impeller 12. The width of the concave portion 1062 of the isolating structure 106 is increased gradually from a side close to the tongue portion 104c of the side wall structure 104 to a side away from the tongue portion 104c. In an embodiment, the width between two side walls 1064 of the concave portion 1062 closest to the tongue portion 104c is W1. The width of the distance between two side walls 1064 of the concave portion 1062 farthest away from the tongue portion 104c is W2. The width W2 is greater than the width W1. As a result, when the airflow flows through the second airflow channel 1046b in the concave portion 1062, since the width of the second airflow channel 1046b is increased gradually towards the rotation direction of the fan hub 120, the volume of the airflow is improved. Then, the airflow resistance due to the casing 10 is reduced. As a result, part of kinetic energy of the airflow is converted to pressure (such as a dynamic pressure and a static pressure) energy. Then, the airflow is dissipated out of the casing 10 from the first subspace 1046 via the air outlet 1042 in the bottom side wall structure 104a.

In FIG. 4C, the bottom 1066 of the concave portion 1062 of the isolating structure 106 is located between two side walls 1064. The distance between the bottom 1066 and the first cover 100 is changed gradually.

In an embodiment, a distance between the bottom 1066 of the concave portion 1062 and the first cover 100 closest to the tongue portion 104c (shown in FIG. 4B) is D1. A distance between the bottom 1066 of the concave portion 1062 and the first cover 100 farthest away from the tongue portion 104c is D2. The distance D2 is greater than the distance D1. The width of the second airflow channel 1046b relative to the first cover 100 is increased gradually towards the rotation direction of the fan hub 120. Therefore, when the airflow flows through the second airflow channel 1046b in the concave portion 1062, the volume of the airflow is improved. Then, the airflow resistance due to the casing 10 is reduced. As a result, part of kinetic energy of the airflow is converted to pressure (such as a dynamic pressure and a static pressure) energy. Then, the airflow is dissipated out of the casing 10 from the first subspace 1046 via the air outlet 1042 in the bottom side wall structure 104a.

Figure 4D:
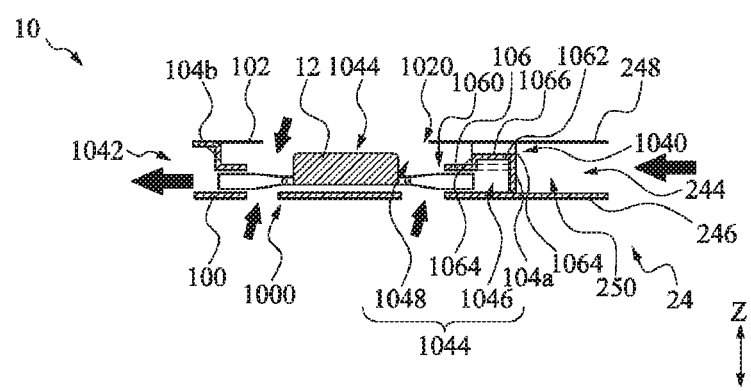

In FIG. 4D, the airflow outside the casing 10 is guided to a guiding space 250 in the guiding channel 24 via the opening 244 of the guiding channel 24. The airflow flows from the first air inlet 1040 in the upper side wall structure 104b (shown in FIG. 3) into the second subspace 1048 in the casing 10 through the guiding space 250. The airflow flows into the first subspace 1046 in the casing 10 from the second subspace 1048 via the through hole 1060 of the isolating structure 106. The airflow flows out of the casing 10 from the first subspace 1046 via the air outlet 1042 in the bottom side wall structure 104a. In an embodiment, the airflow flows into the casing 10 from the second air inlet 1020 or the third air inlet 1000 along the direction Z. Then, the airflow volume at the air inlet and the air outlet of the centrifugal fan 2 is improved.

Figure 5A:
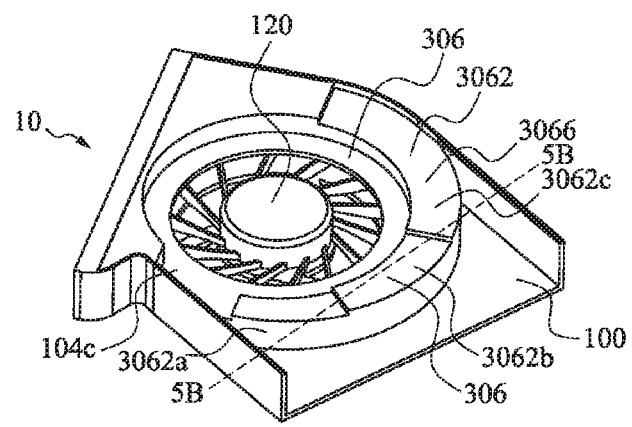
FIG. 5A is a schematic diagram showing a centrifugal fan in an embodiment.
Figure 5B:
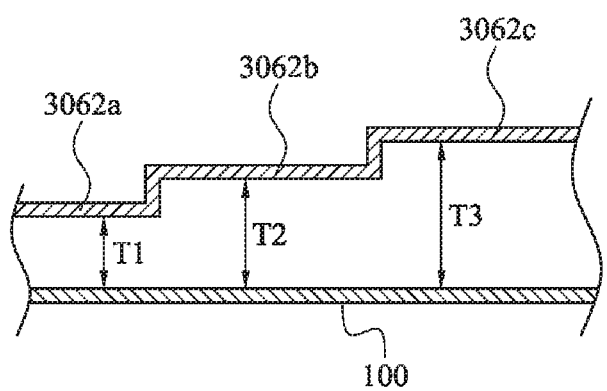
FIG. 5B is a partial section view of a centrifugal fan along a line 5B-5B in FIG. 5A.

Please refer to FIG. 5A and FIG. 5B. FIG. 5A is a schematic diagram showing a centrifugal fan 3 in an embodiment. FIG. 5B is a partial section view of a centrifugal fan along a line 5B-5B in FIG. 5A. As shown in FIG. 5A and FIG. 5B, in the embodiment, the structure, the function and the connection between the components of the casing 10 and the fan impeller 12 of the centrifugal fan 3 are similar to that of the centrifugal fan 2 in FIG. 3, which is not repeated herein.

The difference between the centrifugal fan 3 and the centrifugal fan 2 in FIG. 3 is that the distance between the first cover 100 and the bottom 3066 of the concave portion 3062 of the isolating structure 306 is increased in a ladder shape towards a direction away from the tongue portion 104c.

In an embodiment, the concave portion 3062 includes a first ladder part 3062a, a second ladder part 3062b and a third ladder part 3062c orderly along a direction away from the tongue portion 104c. A distance between a bottom of the first ladder part 3062a and the first cover 100 is T1. A distance between a bottom of the second ladder part 3062b and the first cover 100 is T2. A distance between the first cover 100 and a bottom of the third ladder part 3062c is T3. The distance T3 is greater than the distance T2. The distance T2 is greater than the distance T1. The distance of the second airflow channel relative to the first cover 100 is increased in a ladder shape along the rotation direction of the fan hub 120. Therefore, when the airflow flows through the second airflow channel in the concave portion 3062, the airflow volume is improved. As long as the first cover 100 and the bottom of the concave portion along a direction away from the tongue portion 104c includes a plurality of difference distances therebetween, the shape and the configuration of the concave portion 3062 are various. In an embodiment, the bottom of the concave portion relative to the first cover 100 is a plane surface, an inclined plane or a curved plane. The distance between the first cover 100 and the bottom of the concave portion changes gradually towards a direction away from the tongue portion 104c.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A centrifugal fan, comprising:
a casing, comprising:
a first cover;
a second cover;
an isolating structure disposed between the first and second covers, concaved towards the second cover to form a concave portion, and having a through hole;
a side wall structure connected between the first cover and the second cover to form an accommodating space and surrounding the isolating structure, wherein the side wall structure includes a bottom side wall between the first cover and the isolating structure and having an air outlet and includes an upper side wall between the second cover and the isolating structure and having a first air inlet, and
the first air inlet is interconnected to the air outlet via the through hole of the isolating structure; and
a fan impeller disposed between the isolating structure and the first cover, wherein the concave portion of the isolating structure is located between an edge of the fan impeller and the side wall structure.

2. The centrifugal fan according to claim 1, wherein the accommodating space is defined into a first subspace and a second subspace via the isolating structure, the first subspace is interconnected to an outside of the casing via the air outlet, the second subspace is interconnected to the outside of the casing via the first air inlet, and the second subspace is connected to the first subspace via the through hole.

3. The centrifugal fan according to claim 2, wherein the centrifugal fan further includes a guiding channel, the guiding channel is interconnected to the side wall structure and includes an opening, and the second subspace is interconnected to the guiding channel via the first air inlet.

4. The centrifugal fan according to claim 3, wherein the guiding channel includes a first guiding side wall and a second guiding side wall, an end of the first guiding side wall and an end of the second guiding side wall are adjacent to two sides of the first air inlet, respectively, the end of the first guiding side wall and the end of the second guiding side wall are extended towards a direction away from the fan impeller.

5. The centrifugal fan according to claim 1, wherein the concave portion includes two side walls opposite to each other and a bottom connected to the two side walls.

6. The centrifugal fan according to claim 5, wherein a distance between the two side walls is changed along a rotation direction of the fan impeller.

7. The centrifugal fan according to claim 5, wherein distances between at least two parts of the bottom and the first cover are different.

8. The centrifugal fan according to claim 7, wherein the distance between the bottom and the first cover is changed gradually.

9. The centrifugal fan according to claim 7, wherein the distance between the bottom and the first cover is changed in a ladder shape.

* * * * *